(12) United States Patent
Park

(10) Patent No.: US 8,057,057 B2
(45) Date of Patent: Nov. 15, 2011

(54) LIGHT UNIT AND LIQUID CRYSTAL DISPLAY DEVICE HAVING THE SAME

(75) Inventor: Jun Seok Park, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 68 days.

(21) Appl. No.: 12/067,007

(22) PCT Filed: Jul. 31, 2007

(86) PCT No.: PCT/KR2007/003664
§ 371 (c)(1),
(2), (4) Date: Mar. 14, 2008

(87) PCT Pub. No.: WO2008/018709
PCT Pub. Date: Feb. 14, 2008

(65) Prior Publication Data
US 2008/0316750 A1    Dec. 25, 2008

(30) Foreign Application Priority Data

Aug. 11, 2006  (KR) .................. 10-2006-0076458
Aug. 16, 2006  (KR) .................. 10-2006-0076997

(51) Int. Cl.
*F21V 29/00*    (2006.01)
*F21V 23/00*    (2006.01)

(52) U.S. Cl. .................. 362/97.3; 362/294; 362/612

(58) Field of Classification Search .................. 362/612, 362/613, 630, 294, 373, 231, 97.3, 249.02, 362/631, 800; 345/102; 349/161; 361/719, 361/721
See application file for complete search history.

(56) References Cited

U.S. PATENT DOCUMENTS

| | | | | |
|---|---|---|---|---|
| 4,777,560 | A | * | 10/1988 | Herrell et al. .................. 361/694 |
| 4,896,168 | A | * | 1/1990 | Newman et al. .............. 347/245 |
| 4,920,409 | A | * | 4/1990 | Yamagishi .................... 348/791 |
| 7,152,988 | B2 | * | 12/2006 | Hung ........................... 362/97.2 |
| 7,196,459 | B2 | * | 3/2007 | Morris ............................. 313/46 |
| 7,252,409 | B2 | * | 8/2007 | Kim ............................... 362/294 |
| 7,320,531 | B2 | * | 1/2008 | West et al. .................... 362/231 |
| 7,324,174 | B2 | * | 1/2008 | Hafuka et al. .................. 349/61 |
| 7,452,109 | B2 | * | 11/2008 | Noh et al. ..................... 362/294 |
| 7,501,752 | B2 | * | 3/2009 | Ohba et al. ................... 313/500 |
| 7,572,026 | B2 | * | 8/2009 | Park ............................ 362/97.3 |
| 2005/0023551 | A1 | | 2/2005 | Mizuyoshi |
| 2006/0028842 | A1 | | 2/2006 | Kim et al. |
| 2006/0164840 | A1 | | 7/2006 | Song et al. |
| 2007/0014098 | A1 | * | 1/2007 | Park et al. ........................ 362/29 |
| 2007/0211205 | A1 | * | 9/2007 | Shibata ......................... 349/161 |
| 2007/0247847 | A1 | * | 10/2007 | Villard .......................... 362/249 |
| 2008/0036398 | A1 | * | 2/2008 | Zommer et al. .............. 315/307 |

FOREIGN PATENT DOCUMENTS

| | | |
|---|---|---|
| JP | 2005-56653 A | 3/2005 |
| JP | 2006-49324 A | 2/2006 |
| JP | 2006-58487 A | 3/2006 |
| JP | 2006-209120 A | 8/2006 |
| KR | 10-2004-0057269 A | 7/2004 |
| KR | 10-2006-0082138 A | 7/2006 |

* cited by examiner

*Primary Examiner* — Stephen F Husar
*Assistant Examiner* — Peggy A. Neils
(74) *Attorney, Agent, or Firm* — Birch, Stewart, Kolasch & Birch, LLP

(57) ABSTRACT

Provided are a light unit and a liquid crystal display (LCD) having the same. The light unit comprises a housing; at least one first printed circuit board (PCB) arranged in the housing in a first direction; at least one second PCB arranged in the housing in a direction opposite to the first direction; and light emitting diodes mounted on the first and second PCBs.

17 Claims, 7 Drawing Sheets

[Fig. 1]
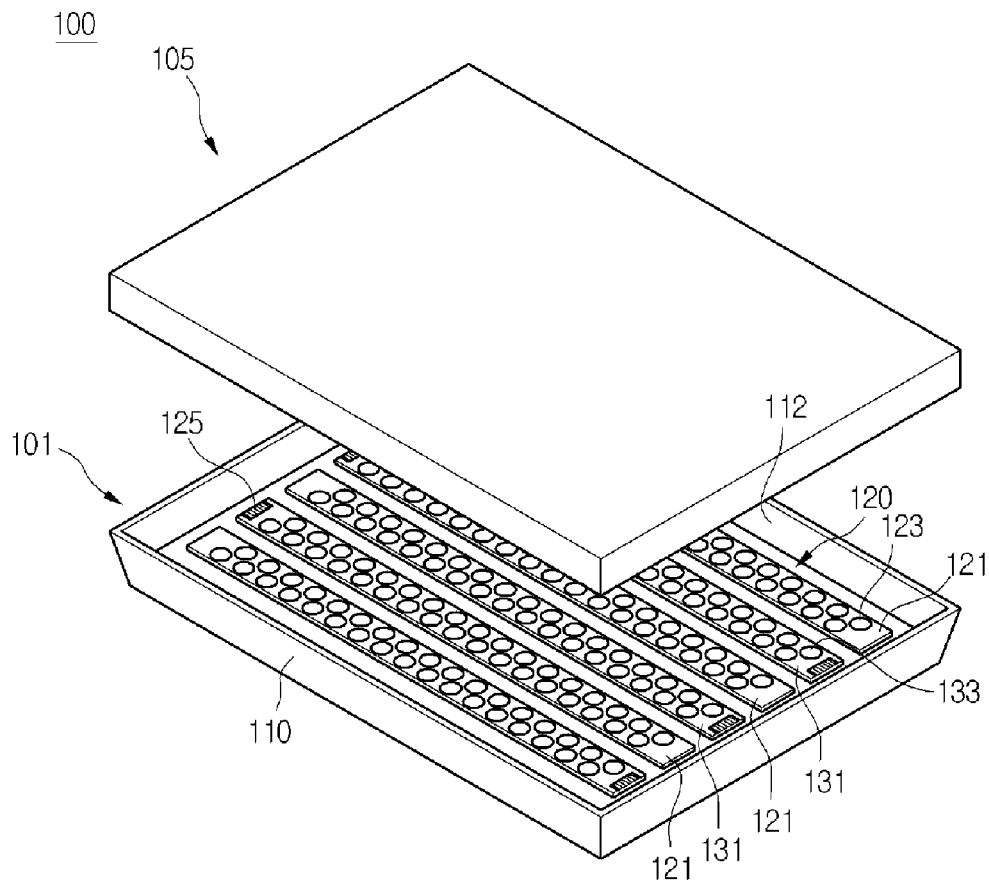
[Fig. 2]
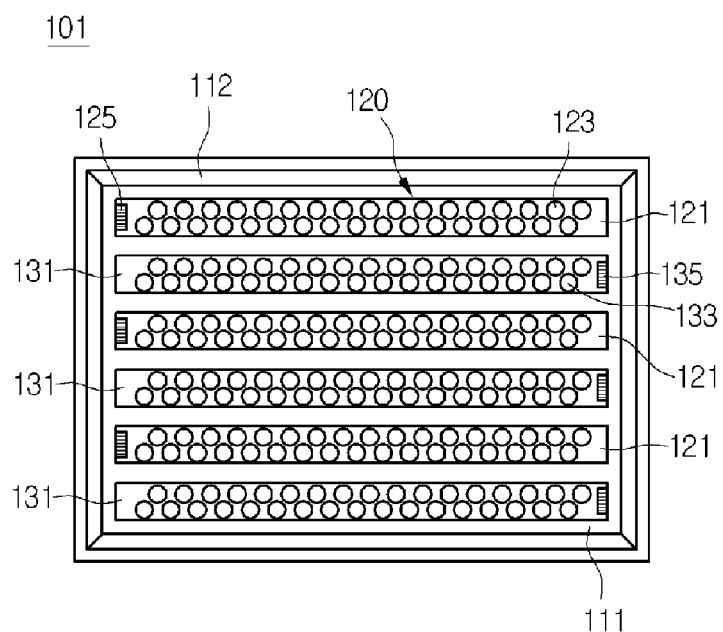

[Fig. 3]
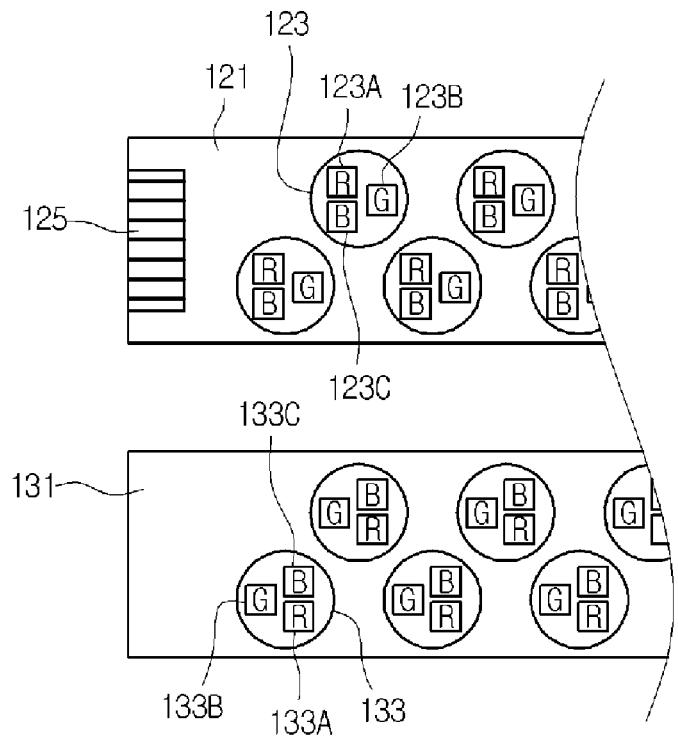
[Fig. 4]
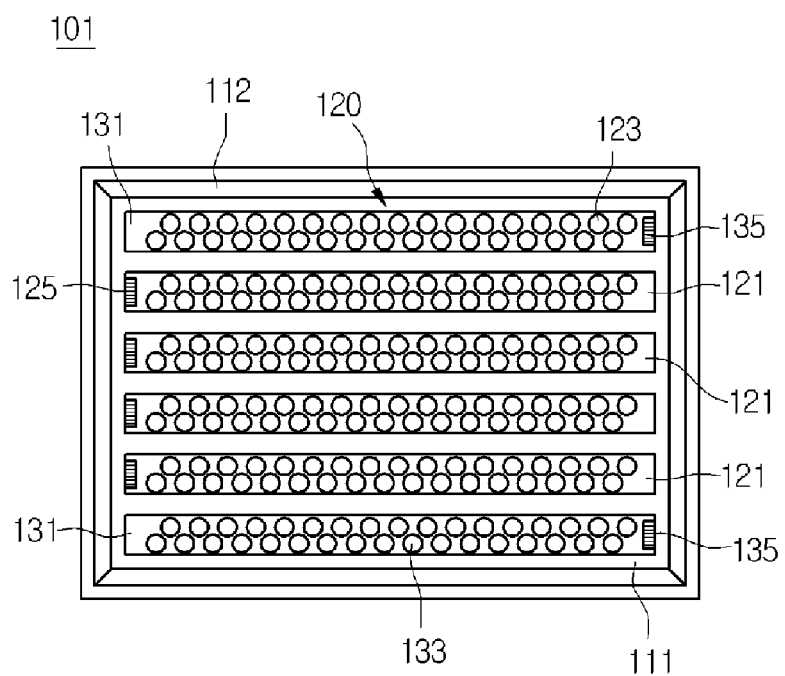

[Fig. 5]
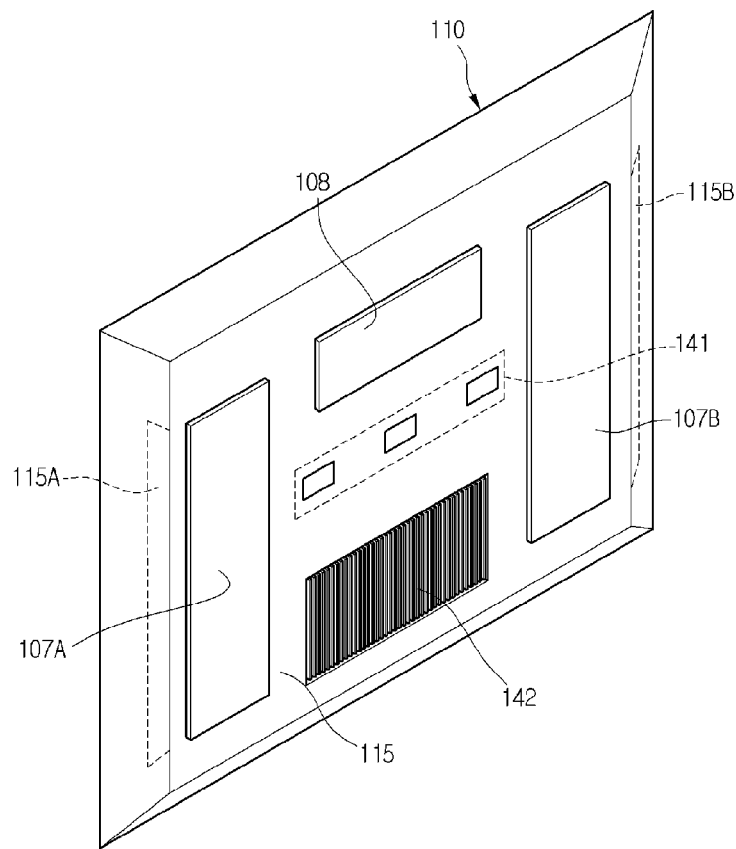
[Fig. 6]
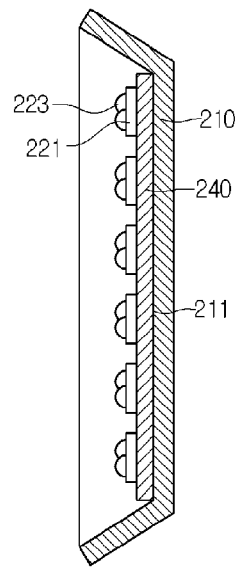

[Fig. 7]
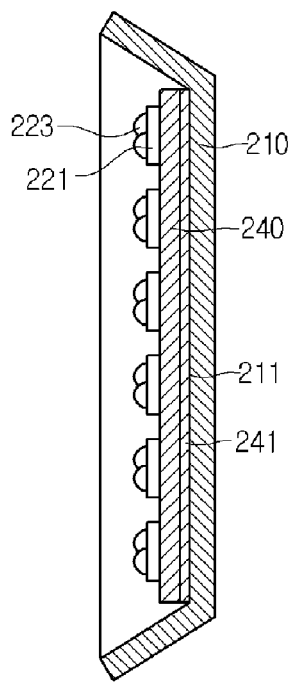
[Fig. 8]
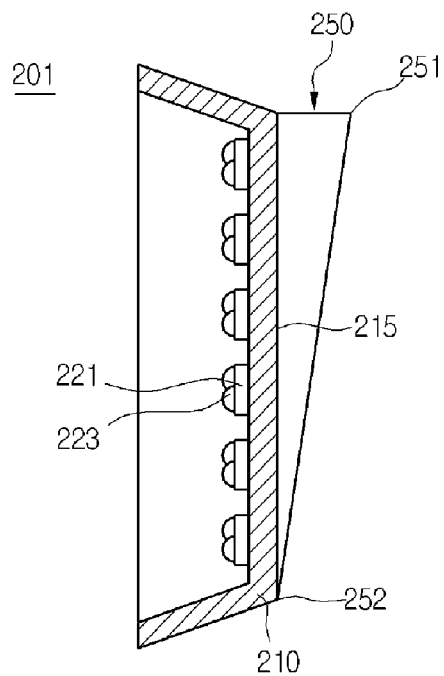

[Fig. 9]
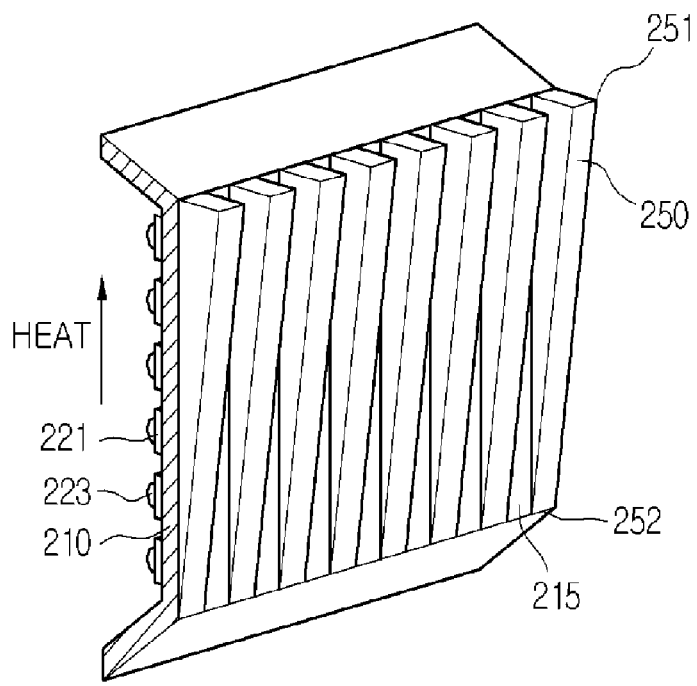
[Fig. 10]
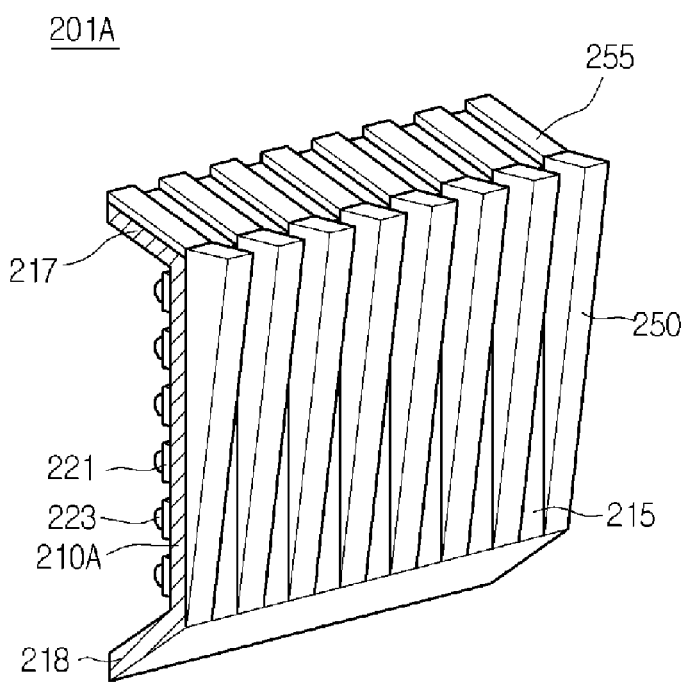

[Fig. 11]
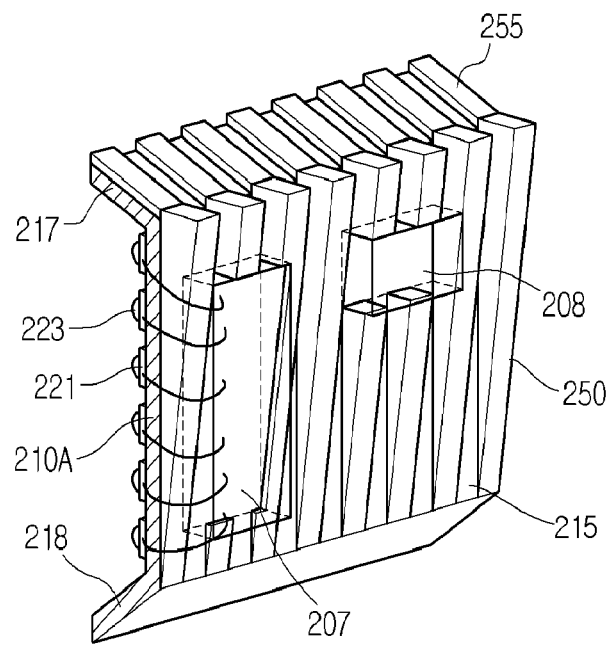
[Fig. 12]
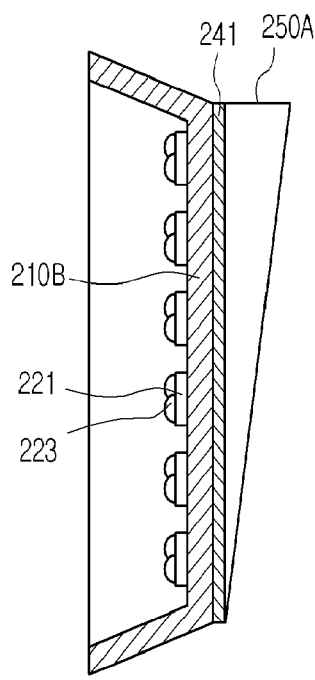

[Fig. 13]
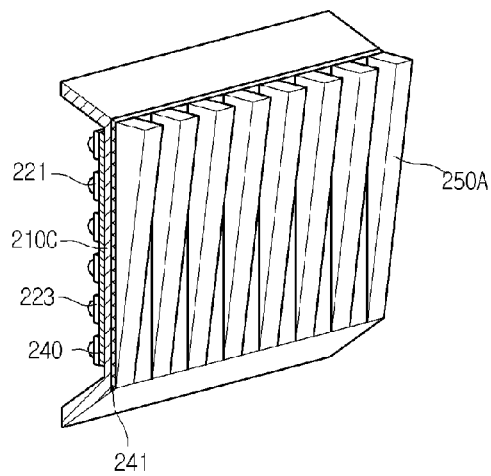
[Fig. 14]
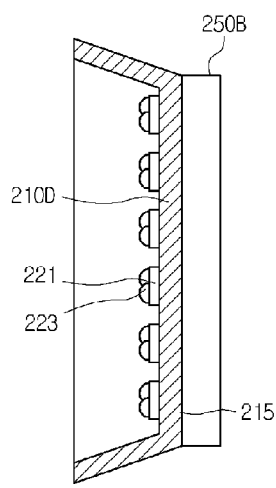
[Fig. 15]
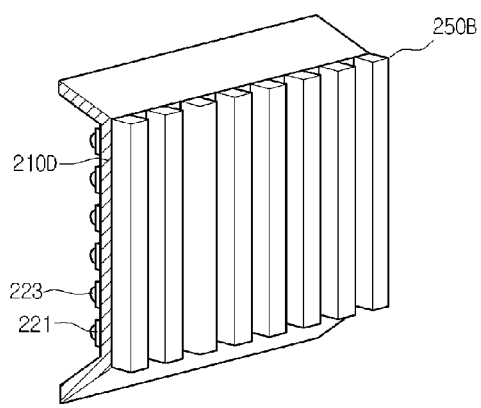

LIGHT UNIT AND LIQUID CRYSTAL DISPLAY DEVICE HAVING THE SAME

TECHNICAL FIELD

Embodiments relate to a light unit and a liquid crystal display device having the same.

BACKGROUND ART

Among various displays such as a liquid crystal display (LCD) using electro-optical effect, a plasma display panel (PDP) using gas discharge and an electro-luminescence display (ELD) device using field emission effect, LCDs are most actively being researched.

Since LCDs are a receive optical device in which images are displayed by controlling light amount inputted from an outside, they essentially need a separate light source, i.e., backlight device, for irradiating an LCD panel.

Such a backlight unit uses a light emitting diode (LED) and a light emitting lamp such as a cold cathode fluorescent lamp (CCFL).

DISCLOSURE OF INVENTION

Technical Problem

Embodiments provide a light unit using a light-emitting diode (LED), and a liquid crystal display (LCD) having the light unit.

Embodiments provide a light unit improving color-mixing properties of light generated from an LED, and an LCD having the light unit.

Embodiments provide a light unit for improving radiant heat, and an LCD having the light unit.

Technical Solution

An embodiment provides a light unit comprising: a housing; at least one first printed circuit board arranged in the housing in a first direction; at least one second printed circuit board arranged in the housing in a direction opposite to the first direction; and light emitting diodes mounted on the first and second printed circuit boards.

An embodiment provides a light unit comprising: a housing comprising a heatsink member; a plurality of printed circuit boards disposed in the housing; and light emitting diodes mounted on the printed circuit boards.

An embodiment provides a liquid crystal display comprising: a liquid crystal panel; and a light unit provided under the liquid crystal panel, and supplying light. wherein, the light unit comprises: a housing; at least one first printed circuit board arranged in the housing in a first direction; at least one second printed circuit board arranged in the housing in a direction opposite to the first direction; and light emitting diodes mounted on the first and second printed circuit boards.

The details of one or more embodiments are set forth in the accompanying drawings and the description below. Other features will be apparent from the description and drawings, and from the claims.

Advantageous Effects

In a light unit and a liquid crystal display (LCD) having the same according to embodiments, printed circuit boards (PCBs) with light emitting diodes (LEDs) mounted are arranged in opposite directions, thus improving color-mixing properties of light emitted from the light unit.

In addition, it is possible to provide a light unit with improved color-mixing properties of light, and an LCD having the light unit.

Furthermore, it is possible to effectively dissipate heat generated in a light unit.

BRIEF DESCRIPTION OF THE DRAWINGS

FIG. 1 is a perspective view of a liquid crystal display (LCD) according to an embodiment.

FIG. 2 is a plan view of a light unit according to an embodiment.

FIG. 3 is a partial enlarged view illustrating a printed circuit board (PCB) of FIG. 2.

FIG. 4 is a plan view illustrating a modified example in which an arranged order of PCBs is changed in a light unit according to an embodiment.

FIG. 5 is a rear perspective view of a light unit according to an embodiment.

FIG. 6 is a side sectional view of a light unit having a first heatsink member according to an embodiment.

FIG. 7 is a side sectional view of a light unit having a second heatsink member according to an embodiment.

FIG. 8 is a side sectional view of a light unit having a third heatsink member according to an embodiment.

FIG. 9 is a rear perspective view illustrating the light unit of FIG. 8.

FIG. 10 is a rear perspective view of a light unit having a fourth heatsink member according to an embodiment.

FIG. 11 is a rear perspective view illustrating a driver coupled to a housing of FIG. 10.

FIG. 12 is a side sectional view of a light unit having a fifth heatsink member according to an embodiment.

FIG. 13 is a rear perspective view of a light unit having a sixth heatsink member according to an embodiment.

FIG. 14 is a side sectional view of a light unit having a seventh heatsink member according to an embodiment.

FIG. 15 is a rear perspective view illustrating the light unit having the seventh heatsink member of FIG. 14.

MODE FOR THE INVENTION

Reference will now be made in detail to the embodiments of the present disclosure, examples of which are illustrated in the accompanying drawings.

FIG. 1 is a perspective view of a liquid crystal display (LCD) 100 having a light unit according to an embodiment. FIG. 2 is a plan view illustrating the light unit of FIG. 1.

Referring to FIG. 1, the LCD 100 includes a light unit 101 and a liquid crystal panel 105.

The light unit 101 is disposed under the liquid crystal panel 105 to supply required light to the liquid crystal panel 105. The liquid crystal panel 105 displays an image corresponding to an inputted image signal using the light supplied from the light unit 101. The liquid crystal panel 105 includes, for example, a thin film transistor (TFT) substrate in which TFTs are arranged in a matrix form, a color filter substrate facing the TFT substrate and attached to the TFT substrate, a liquid crystal layer disposed between the TFT substrate and the color filter substrate, and a spacer maintaining a cell gap between the TFT substrate and the color filter substrate. Here, the liquid crystal layer adjusts light transmittance depending on electric field formed between the TFT substrate and the color filter substrate. In addition, a polarizing plates may be provided at both sides of the liquid crystal panel. The embodiment, however, is not limited to the above-described liquid crystal panel.

The light unit 101 includes a housing 110, a printed circuit board (PCB) 120, and light emitting diodes (LEDs) 123 and 133. Furthermore, although not shown, the light unit 101 may further include optical sheets such as a prism sheet and a diffusion sheet.

The housing 110 may be formed in the shape of a rectangular frame made of metallic material. For example, the metallic material may include at least one selected from the group consisting of aluminum (Al), magnesium (Mg), zinc (Zn), titanium (Ti), tantalum (Ta), hafnium (Hf), and niobium (Nb).

An outer side 112 of the housing 110 is inclined at a predetermined angle with respect to a base of the housing 110, and thus used as a reflector. In addition, a reflective sheet may be provided inside the housing 110.

The printed circuit board 120 with LEDs 123 and 133 is received in the housing 110. Here, the printed circuit board 120 includes a first PCB 121 arranged in a first direction and a second PCB 131 arranged in a second direction opposite to the first direction.

Here, the first and second printed circuit boards 121 and 131 are arranged such that they alternate each other in singularity or plurality.

Connectors 125 and 135 for external connection are respectively provided on ends of the first and second PCBs 121 and 131 for connecting the first and second PCBs 121 and 131 to the outside, and the connectors 125 and 135 are integrally formed with the first and second PCBs 125 and 135, or formed separately and coupled to the first and second PCBs 125 and 135.

The first and second PCBs 121 and 131 may be configured with a plurality of LED bars depending on a screen size. The PCBs having the LED bars may be mixedly arranged in predetermined directions.

The LEDs 123 and 133 are mounted on the first and second PCBs 121 and 131, and emit light. The LEDs 123 and 133 may include at least one of a red LED chip, a green LED chip and a blue LED chip. For example, the LEDs 123 and 133 may be realized as a single package having three-color LED chips or another package having a blue LED chip using a phosphor. The embodiment, however, is not limited to the above-described LEDs and LED chips.

The number of columns of LEDs 123 and 133 mounted on the first and second PCBs 121 and 131 is one or more. When the number of columns is two or more, LEDs in neighboring columns may be arranged in a zigzag fashion.

Light emitted from the LEDs 123 and 133 are mixed together by virtue of the arrangement of the first and second PCBs 121 and 131, and thus the light is supplied as a light source of the liquid crystal panel 105.

Here, the LEDs 123 and 133 mounted on the first and second PCBs 121 and 131 may be arranged so as to uniformly emit light according to arrangement directions of the first and second PCBs 121 and 131.

FIG. 3 is a partial enlarged view illustrating the first and second PCBs 121 and 131 of FIG. 2.

Referring to FIG. 3, the LEDs 123 mounted on the first PCB 121 are positioned in order of a red LED chip 123A, a green LED chip 123B, and a blue LED chip 123C clockwise. The LEDs 133 mounted on the second PCB are positioned in order of a blue LED chip 133C, a red LED chip 133B, and a green LED chip 133A clockwise.

As such, positions of the LED chips 123A, 123B, 123C in the LED 123 and the LED chips 133A, 133B, 133C in the LED 133 are changed according to the arrangement directions of the first and second PCBs 121 and 131 so that it is possible to improve color-mixing properties of the light emitted from the LEDs 123 and 133.

Although the first and second PCBs 121 and 131 are arranged in opposite directions to each other in this embodiment, the first and second PCBs 121 and 131 may be arranged in the same directions and the LEDs 123 and 133 are arranged in opposite directions to each other. This configuration also improves color-mixing properties.

FIG. 4 is another example of a light unit according to an embodiment.

Referring to FIG. 4, the second PCBs 131 are disposed in upper and lower regions of the housing 110, and the first PCBs 121 are disposed in a middle region of the housing 110. Here, the first PCBs 121 are arranged in a first direction, and the second PCBs 131 are arranged in a direction opposite to the first direction.

In such a configuration, a portion of light emitted from the LED 133 of the second PCB 131 is reflected by the outer side 112 of the housing 110, and the reflected light is mixed with light emitted from the LED 123 of the first PCB 121. Accordingly, it is possible to resolve a problem that color-mixing property is deteriorated at the outer side of the housing 110.

The arrangement of the PCB 120, i.e., the first and second PCBs 121 and 131, may be variously modified in the embodiments such that the color-mixing properties of light emitted in the housing 110 can be improved, thus enhancing a brightness uniformity of light.

FIG. 5 is a rear perspective view of the housing 110 according to an embodiment.

Referring to FIG. 5, first and second LED drivers 107A and 107B, a semiconductor heatsink element 141, a liquid crystal panel driver 108, and heatsink fins 142 are provided on a rear surface 115 of the housing 110.

The first and second LED drivers 107A and 107B are disposed at left and right sides of the rear surface 115 of the housing 110, respectively, and connected to the connectors for external connection of the first and second PCBs, respectively. Therefore, the LEDs mounted on the first and second PCBs are individually controlled using the first and second LED drivers 107A and 107B.

Here, line grooves 115A and 115B are provided in left and right surfaces of the housing 110, and lines for connecting the LED drivers 107A and 107B can be pulled out through the line grooves 115A and 115B. However, the embodiment is not limited to the above-described structure.

In addition, the semiconductor heatsink element 141, the heatsink fins 142, the liquid crystal panel driver 108 are further provided on the rear surface 115 of the housing 110. The semiconductor heatsink element 141 may be realized with, for example, a Peltier device of pumping heat using the semiconductor principle.

A variety of kinds of heatsink members as well as the semiconductor heatsink element 141 and the heatsink fins 142 may be selectively provided on the housing 110, which will be more fully described in FIGS. 6 to 15.

FIGS. 6 to 15 illustrate examples of heatsink members provided in the light unit according to embodiments. Below-described embodiments are not limited to the arrangements of PCBs and light sources (LED and the like), and description for duplicate elements will be omitted below.

FIG. 6 is a side sectional view of a light unit 201 having a first heatsink member according to an embodiment.

Referring to FIG. 6, the first heatsink member of the light unit 201 includes a heatsink plate 240. The heatsink plate 240 is attached to a base 211 of a housing 210, and disposed between a plurality of PCBs 221 and the base 211 of the housing 210.

The heatsink plate 240 may be formed of, for example, aluminum so that heat generated from the plurality of PCBs 221 is conducted through the housing 210, thus improving heatsink effect. Here, the heatsink plate 240 may include a metal of which heat conductivity is higher than that of the housing 210.

In addition, a surface of the heatsink plate 240 may be coated with a reflective material. Alternatively, a reflective material may be attached to the surface of the heatsink plate 240.

FIG. 7 is a side sectional view of a light unit 201 having a second heatsink member according to an embodiment.

Referring to FIG. 7, the second heatsink member of the light unit 201 includes a heatsink plate 240 and a heatsink sheet 241. The heatsink sheet 241 is attached to the base 211 of the housing 210, the heatsink plate 240 is attached on the heatsink sheet 241, and the PCBs 221 are attached on the heatsink plate 240. Both sides of the heatsink sheet 241 are attached between the base 211 of the housing 210 and the heatsink plate 240 using an adhesive agent. Materials that may be used for the heatsink sheet 241 include, for example, graphite, ceramic, copper and aluminum.

Herein, positions of the heatsink plate 240 and the heatsink sheet 241 may be exchanged. Furthermore, a surface of the heatsink plate 240 may be coated with a reflective material. Alternatively, a reflective material may be attached to the surface of the heatsink plate 240.

FIG. 8 is a side sectional view of a light unit 201 having a third heatsink member according to an embodiment, and FIG. 9 is a rear perspective view illustrating the light unit 201 of FIG. 8.

Referring to FIGS. 8 and 9, the third heatsink member of the light unit 201 includes a plurality of heatsink bars 250. The heatsink bars 250 are provided on a rear surface 215 of the housing 210. The plurality of heatsink bars 250 are arranged such that they have a stripe pattern in a vertical direction, and they are arranged convexedly and concavely in a horizontal direction.

The heatsink bar 250 may be integrally formed on the rear surface of the housing 210 using a die casting method.

For example, the heatsink bar 250 may be formed in the shape of a triangle, e.g., right-angled triangle. Here, the heatsink bar 250 has the shape of a right-angled triangle so that a sectional area of the heatsink bar 250 is greatest in an upper portion 251 of the housing 210 and smallest in a lower portion 252. That is, the heatsink bar 250 has a volume distribution in consideration of a heat-flow direction in the housing 210. This is why a temperature is relatively higher in the upper portion 251 of the housing 210 than the lower portion 252, when the housing 210 stands upright. The heatsink bar 250 effectively dissipate heat corresponding to this temperature distribution.

In addition, the heatsink bar 250 is surface-treated using an anodizing process, for example, a black anodizing process so that heat absorption and dissipation can be effectively performed. Here, the anodizing process is to color the surface of the heatsink bar 250 through current flowing.

FIG. 10 is a rear perspective view of a light unit 201A having a fourth heatsink member according to an embodiment.

Referring to FIG. 10, the fourth heatsink member of the light unit 201A includes pluralities of heatsink bars 250 and 255 disposed on a plurality of surfaces of the housing. The heatsink bars 250 and 255 extend from the rear surface 215 of a housing 210A to an upper side 217 of the rear surface 215.

Here, the heatsink bar 250 disposed on the rear surface 215 of the housing 210A has a shape of a right-angled triangle but the heatsink bar 255 disposed on the upper side 217 of the rear surface 215 has a shape of a rectangle. The heatsink bars 250 and 255, which are disposed on the rear surface 215 of the housing 210A and the upper side 217 of the rear surface 215, may be arranged in a zigzag fashion.

The upper side 217 of the rear surface 215 of the housing 210A may have a smaller thickness than a lower side 218 of the rear surface 215.

Anodizing may be performed on the surfaces of the heatsink bars 250 and 255 and/or the rear surface 215 of the housing 210A.

FIG. 11 is a rear perspective view illustrating a driver coupled to the housing 210A of FIG. 10.

Referring to FIG. 11, after removing predetermined portions of the heatsink bar 250 disposed on the rear surface 215 of the housing 210A, the LED driver 207 and the liquid crystal panel driver 208 may be provided in the removed portions, respectively.

Here, the LED driver 207 may be disposed in a region where it can be connected to the connectors of a PCB 221 inside the housing 210A as short as possible or disposed in the most thermally stable region.

FIG. 12 is a side sectional view of a light unit 201B having a fifth heatsink member according to an embodiment.

Referring to FIG. 12, the fifth member of the light unit 201B includes a heatsink sheet 241 and a heatsink bar 250A. The heatsink sheet 241 is attached to the rear surface of the housing 210B, and the heatsink bar 250A having the shape of a stripe type right-angled triangle is attached to the heatsink sheet 241. Here, the stripe type heatsink bars 250A are fastened to the housing 210B with a fastening unit such as screws passing outward through the inside of the housing 210B.

FIG. 13 is a rear perspective view of a light unit 201C having a sixth heatsink member according to an embodiment.

Referring to FIG. 13, the sixth member of the light unit 201C includes a heatsink plate 240, a heatsink sheet 241 and a heatsink bar 250A.

The heatsink plate 240 is attached to a base of a housing 210C so that heat generated from the PCB 221 is conducted through the housing 210C.

The heatsink sheet 241 and the stripe type heatsink bar 250A are provided on the rear surface of the housing 210C. The heatsink sheet 241 is attached to the rear surface of the housing 210C, and the stripe type heatsink bar 250A is attached to the heatsink sheet 241. The heatsink bars 250A may be fixed to the housing with a fastening unit such as screws passing outward through the inside of the housing 210C.

The heatsink plate 240, the heatsink sheet 241, and the heatsink bar 250A disposed inside and outside the housing 210C can dissipate heat around the housing 210C effectively.

FIG. 14 is a side sectional view of a light unit 201D having a seventh heatsink member according to an embodiment, and FIG. 15 is a rear perspective view illustrating the light unit 201D having the seventh heatsink member of FIG. 14.

Referring to FIGS. 14 and 15, a seventh heatsink member of the light unit 201D is provided with a heatsink bar 250B in the shape of a rectangle, and integrally formed on the rear surface 215 of the housing 210D using a die casting process.

This heatsink bar 250B may be integrally provided on, or separately provided and coupled to the rear surface of the housing 210D. In addition, the heatsink bar 250B may be provided on other surfaces (e.g., an upper surface) as well as the rear surface 215 of the housing 210D. Although not shown, the heatsink bars 250B having triangular and rectangular shapes may be mixedly provided on the rear surface and/or the upper surface of the housing 210D.

In the above-described embodiments, at least one of the various heatsink members is provided to the light unit, thereby preventing the characteristics of LEDs from being deteriorated due to heat generated in the light unit.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

In a light unit and a liquid crystal display (LCD) having the same according to embodiments, printed circuit boards (PCBs) with light emitting diodes (LEDs) mounted are arranged in opposite directions, thus improving color-mixing properties of light emitted from the light unit.

In addition, it is possible to provide a light unit with improved color-mixing properties of light, and an LCD having the light unit.

Furthermore, it is possible to effectively perform dissipating heat generated in a light unit.

The invention claimed is:

1. A light unit, comprising:
   a housing including a first side, a second side opposite to the first side, a third side, and a fourth side opposite to the third side;
   a first printed circuit board arranged in the housing in a first direction from the first side to the second side, wherein the first printed circuit board includes a first connector arranged adjacent to the first side of the housing;
   a second printed circuit board arranged in the housing in the first direction and adjacent to the first printed circuit board, wherein the second printed circuit board includes a second connector arranged adjacent to the second side of the housing;
   a third printed circuit board arranged in the housing in the first direction and adjacent to the second printed circuit board, wherein the third printed circuit board includes a third connector arranged adjacent to the first side of the housing; and
   light emitting diodes mounted on the first, second and third printed circuit boards,
   wherein, in the first printed circuit board, the first connector and the light emitting diodes on the first printed circuit board are disposed in a first line, and the light emitting diodes on the first printed circuit board are arranged between the first connector and the second side,
   wherein, in the second printed circuit board, the second connector and the light emitting diodes on the second printed circuit board are disposed in a second line, and the light emitting diodes on the second printed circuit board are arranged between the second connector and the first side,
   wherein, in the third printed circuit board, the third connector and the light emitting diodes on the third printed circuit board are disposed in a third line, and the light emitting diodes on the third printed circuit board are arranged between the third connector and the second side, and
   wherein there is only one connector on each printed circuit board and a connector of an adjacent printed circuit board is alternately and oppositely positioned.

2. The light unit according to claim 1, wherein the first and second printed circuit boards are arranged such that they alternate each other in singularity or plurality.

3. The light unit according to claim 1, wherein the light emitting diode comprises at least one of a red light emitting diode chip, a green light emitting diode chip and a blue light emitting diode chip.

4. The light unit according to claim 1, further comprising:
   a heatsink member provided on at least one of a base, a rear surface and a side surface of the housing,
   wherein the heatsink member comprises at least one of a heatsink sheet, a heatsink plate and a heatsink bar.

5. The light unit according to claim 1, wherein the housing has a shape of a rectangular frame, and an outer side of the housing is inclined at a predetermined angle with respect to a base of the housing, the predetermined angle arranged to reflect leakage light.

6. The light unit according to claim 1, wherein each of the first and second printed circuit boards comprises a plurality of light emitting diode bars connected in series.

7. A light unit, comprising:
   a housing including a first side, a second side opposite to the first side, a third side, and a fourth side opposite to the third side;
   a plurality of printed circuit boards disposed on a front surface of the housing;
   a plurality of heatsink bars disposed on a rear surface of the housing, wherein, in each of the plurality of heatsink bars, a heatsink bar area adjacent to the third side is greater than a heatsink bar area adjacent to the fourth side;
   a heatsink sheet between the housing and the plurality of heatsink bars and between the housing and the plurality of printed circuit boards; and
   light emitting diodes mounted on the plurality of printed circuit boards.

8. The light unit according to claim 7, wherein at least one of the printed circuit boards includes:
   a first connector arranged at the first side of the housing, and
   a second connector arranged at the second side of the housing.

9. The light unit according to claim 7,
   wherein the plurality of printed circuit boards comprises a first printed circuit board and a second printed circuit board,
   wherein the light emitting diodes include a first light emitting diode mounted on the first printed circuit board and a second light emitting diode mounted on the second printed circuit board, and
   wherein the first light emitting diode has a brightness distribution different from a brightness distribution of the second light emitting diode.

10. The light unit according to claim 7, wherein each of the plurality of heatsink bars is formed separately from the housing and is coupled to the housing, each of the plurality of heatsink bars having a stripe type right-angled triangle shape.

11. The light unit according to claim 7, wherein a surface of each of the plurality of heatsink bars is anodized.

12. The light unit according to claim 7, further comprising:
a light emitting diode driver; and
a liquid crystal panel driver disposed on a portion of a rear surface of the housing.

13. A liquid crystal display, comprising:
a liquid crystal panel; and
a light unit provided under the liquid crystal panel, and configured to supply light,
wherein the light unit comprises:
- a housing including a first side, a second side opposite to the first side, a third side, and a fourth side opposite to the third side;
- a first printed circuit board arranged in the housing in a first direction from the first side to the second side, wherein the first printed circuit board includes a first connector arranged adjacent to the first side of the housing;
- a second printed circuit board arranged in the housing in the first direction and adjacent to the first printed circuit board, wherein the second printed circuit board includes a second connector arranged adjacent to the second side of the housing;
- a third printed circuit board arranged in the housing in the first direction and adjacent to the second printed circuit board, wherein the third printed circuit board includes a third connector arranged adjacent to the first side of the housing; and
- light emitting diodes mounted on the first, second and third printed circuit boards, wherein, in the first printed circuit board, the first connector and the light emitting diodes on the first printed circuit board are disposed in a first line, and the light emitting diodes on the first printed circuit board are arranged between the first connector and the second side,
wherein, in the second printed circuit board, the second connector and the light emitting diodes on the second printed circuit board are disposed in a second line, and the light emitting diodes on the second printed circuit board are arranged between the second connector and the first side,
wherein, in the third printed circuit board, the third connector and the light emitting diodes on the third printed circuit board are disposed in a third line, and the light emitting diodes on the third printed circuit board are arranged between the third connector and the second side,
wherein the light unit further comprises at least one of:
- a heatsink sheet provided on the housing;
- a heatsink plate provided on the housing;
- a semiconductor heatsink element provided on the housing;
- a heatsink fin provided on the housing; and
- a heatsink bar provided on the housing, wherein the housing includes a base and side surfaces,
wherein the base is formed in a rectangular frame and has first and second short edges and third and fourth long edges, and
wherein the heatsink bar is provided on a rear surface of the housing, and the heatsink bar has an area in a third direction adjacent to the third long edge greater than an area in a fourth direction adjacent to the fourth long edge opposite to the third direction.

14. The liquid crystal display according to claim 13, wherein the light unit further comprises:
a diffusion sheet and a prism sheet disposed on the light emitting diode.

15. A display unit, comprising:
a display panel;
a housing including a base and side surfaces;
a plurality of printed circuit boards disposed in the housing, the plurality of printed circuit boards being arranged in a first direction and parallel to each other, each of the printed circuit board comprising one connector;
a heatsink bar disposed on the housing, the heatsink bar being arranged substantially perpendicular to the first direction; and
light emitting diodes mounted on the plurality of printed circuit boards,
wherein at least one connector of the printed circuit board is positioned at a different portion where the connector of another printed circuit board is positioned, and
wherein a height of the heatsink bar varies.

16. The light display unit according to claim 15, wherein a height of the heatsink bar is highest at one end of the heatsink bar, and the height of the heatsink bar lowers continuously toward an opposite end of the heatsink bar.

17. The display unit according to claim 15, wherein the heatsink bar is disposed on a rear surface of the housing.

* * * * *